US007429195B2

(12) United States Patent
Buckmeier et al.

(10) Patent No.: US 7,429,195 B2
(45) Date of Patent: Sep. 30, 2008

(54) CONNECTOR INCLUDING ISOLATION MAGNETIC DEVICES CAPABLE OF HANDLING HIGH SPEED COMMUNICATIONS

(75) Inventors: Brian J. Buckmeier, San Diego, CA (US); John Hess, Dallastown, PA (US); Edwin Edralin, San Diego, CA (US); Joe Berry, San Diego, CA (US)

(73) Assignee: Bel Fuse (Macao Commercial Offshore) Ltd.

( * ) Notice: Subject to any disclaimer, the term of this patent is extended or adjusted under 35 U.S.C. 154(b) by 0 days.

(21) Appl. No.: 11/675,701

(22) Filed: Feb. 16, 2007

(65) Prior Publication Data
US 2008/0197959 A1 Aug. 21, 2008

(51) Int. Cl.
*H01R 33/945* (2006.01)
(52) U.S. Cl. .............................. 439/620.05; 439/620.09
(58) Field of Classification Search ............ 439/620.01, 439/620.05, 620.06, 620.07, 620.09
See application file for complete search history.

(56) References Cited

U.S. PATENT DOCUMENTS

| 6,702,610 | B2 * | 3/2004 | Zheng et al. ............. 439/541.5 |
| 6,709,295 | B2 * | 3/2004 | Givens et al. .......... 439/620.06 |
| 6,739,915 | B1 * | 5/2004 | Hyland et al. ............... 439/676 |
| 6,872,098 | B2 * | 3/2005 | Wojtacki et al. ............ 439/676 |
| 7,033,210 | B1 * | 4/2006 | Laurer et al. ............. 439/541.5 |
| 7,140,923 | B2 * | 11/2006 | Karir et al. .................. 439/676 |

* cited by examiner

*Primary Examiner*—Kheim Nguyen
(74) *Attorney, Agent, or Firm*—Wolfblock LLP

(57) ABSTRACT

An electric device capable of handling high speed data communication and which could be used with, for example, a connector application such as an RJ45 type connector. The electric device is formed by inserting at least one wire through a first hole in a core, wrapping the wire around a side of the core, and inserting the wire through a second hole in the core a desired number of times. A common mode choke may be combined with the electric device. To form such a choke, two of the wires from the electric device may be wrapped around a second core in the same fashion a desired number of times.

20 Claims, 5 Drawing Sheets

CONNECTOR INCLUDING ISOLATION MAGNETIC DEVICES CAPABLE OF HANDLING HIGH SPEED COMMUNICATIONS

BACKGROUND OF THE INVENTION

Regulations for connector technology are evolving. As signal speeds increase and the connector industry desires to move data faster over a Cat 5 or equivalent cable, there is a need for isolating magnetic devices capable of handling higher magnetizing forces and DC current bias. In a typical RJ45 type connector assembly where a modular plug mates in a male-female relationship with a modular jack, an isolating magnetic device is used in the female connector portion to handle direct current ("DC") offsets. Such offsets may be caused by various factors including imbalances in the wires of the plug.

For example, data is frequently transmitted over a pair of conductive wires. When transmitting data, the pair of wires may ideally have voltage potentials to ground such that a voltage in one wire of the pair is equal and opposite to the voltage in the other wire of the pair. For example, one wire may have a potential of −2.5 volts and the other wire may have a potential of +2.5 volts. If there are imbalances in the pair of wires or extraneous electro-magnetic interference, the two wires may not have exactly equal and opposite voltages. For example, one wire may have −2 volts and the other wire may have +3 volts. Although there is still a net difference across the pair of wires of +5 volts (which may, for example, correspond to a logic "1"), such a voltage imbalance will generate a current imbalance. Conventional technology uses isolating magnetic devices and/or transformers to deal with such imbalances. However, prior art magnetic devices cannot physically handle the magnetizing force which may be induced by imbalanced DC current having high frequencies.

As an illustrative example, referring to FIG. 1, there is shown a transformer 40 in accordance with the prior art. Transformer 40 may be used as an isolating magnetic device. Transformer 40 is formed by winding wires 44, 46, 48 and 50 around a toroid shaped core 42. Core 42 has a substantially circular cross-section. Wires 44, 46, 48 and 50 are evenly wound around core 42 except in a gap area 38.

Such prior art solutions as discussed above can handle perhaps as much as 2 million bits per second. However, newer standards require that communications occur as high as one (1) or even ten (10) gigabits per second. The above prior art isolation magnetic device generally does not have the frequency response characteristic needed to inhibit the presence of DC current bias with communications of such speeds. Even those solutions capable of handling high speed (e.g. 2M bits per second) communications are not backward compatible (i.e. they cannot handle slower communications) and are frequently not in a conventional RJ45 type connector format. Such a format is common in the industry and most users have become comfortable with it.

Therefore, there is a need in the art for an isolation magnetic device which can handle high speed communications, is backward compatible, and which can conform to standard RJ45 type connector arrangements. There is also a need for a method for manufacturing such a device.

SUMMARY OF THE INVENTION

One aspect of the invention is a connector for enabling electrical communication with a plug. The connector comprises at least one contact effective to communicate with a terminal of a plug, a magnetic filter circuit in communication with the contact, and a terminal in communication with the magnetic filter circuit. The magnetic filter circuit includes an electric device formed by inserting at least one wire through a first hole of a core and wrapping the at least one wire around a side of the core. The electric device is further formed by inserting the at least one wire through a second hole of the core, the second hole of the core being spaced from the first hole and having a longitudinal axis extending parallel to a longitudinal axis of the first hole.

Another aspect of the invention is a connector for enabling electrical communication with a plug. The connector comprises at least one contact effective to communicate with a terminal of a plug, a magnetic filter circuit in communication with the contact and a terminal in communication with the magnetic filter circuit. The magnetic filter circuit includes an electric device, the electric device including a core, the core having a first hole with a first longitudinal axis and a second hole spaced from the first hole, the second hole having a second longitudinal axis parallel to the first longitudinal axis. The core includes at least one wire inserted through the first hole, wrapped around a side of the core and inserted through the second hole.

Yet another aspect of the invention is a method for producing a connector for enabling electrical communication with a plug. The method comprises inserting at least one wire through a first hole of a core, and wrapping the at least one wire around a side of the core. The method further comprises inserting the at least one wire through a second hole of the core to form an electric device, the second hole of the core being spaced from the first hole and having a longitudinal axis extending parallel to a longitudinal axis of the first hole and coupling the electric device to at least one terminal. The method further comprises coupling the electric device to at least one contact.

BRIEF DESCRIPTION OF THE DRAWINGS

A more complete appreciation of the present invention and many of the attendant advantages thereof will be readily understood by reference to the following detailed description when taken in conjunction with the accompanying drawings in which.

DETAILED DESCRIPTION OF THE PREFERRED EMBODIMENT(S)

Figure 1:
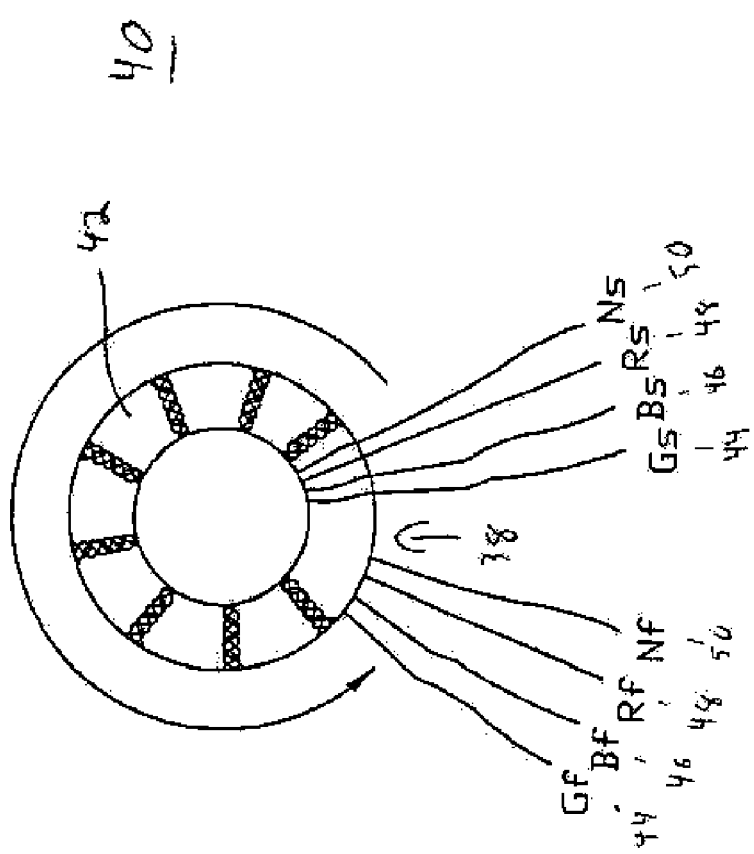
FIG. 1 is a front view of a transformer in accordance with the prior art.
Figure 2:
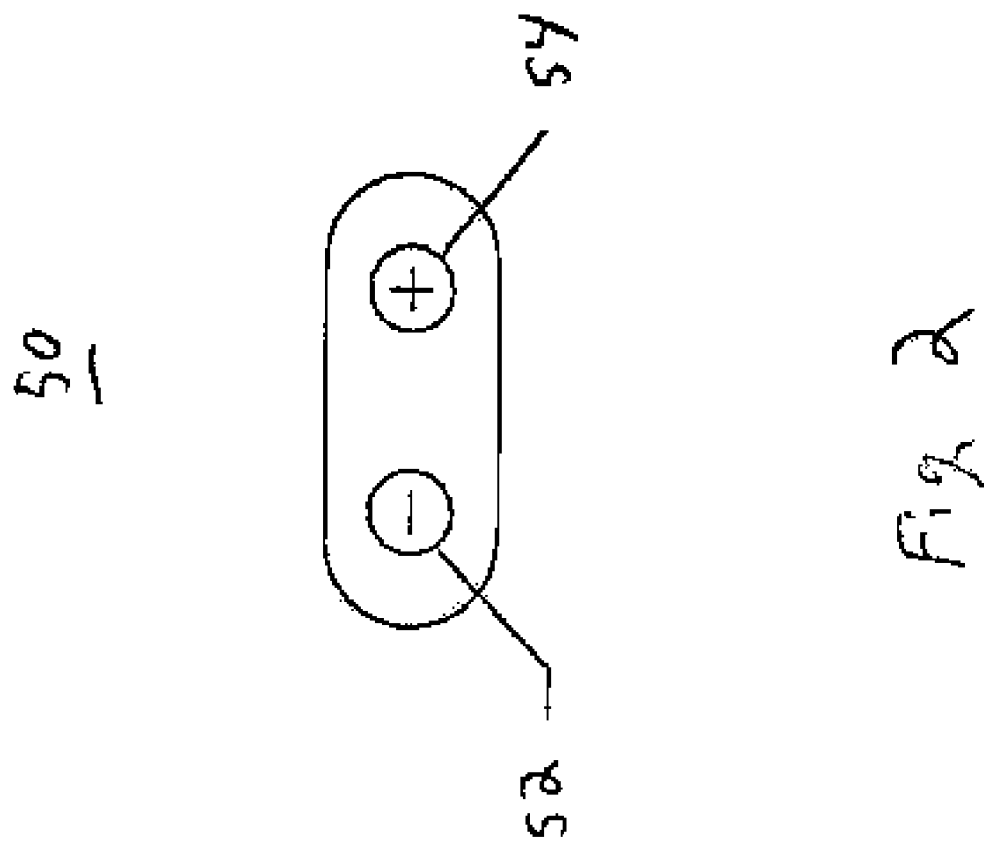
FIG. 2 is a side view of a core for use in accordance with an embodiment of the invention.

Referring now to the drawings wherein like reference numerals describe identical or corresponding parts throughout the several views, and more particularly to FIG. 2, a core 50 is shaped substantially like an ellipsoid with its ends cut off and has a substantially racetrack-shaped cross-section. Core 50 includes a first hole 52 and a second hole 54. Core 50 may have, for example, a material permeability of 5,000.

Figure 3:
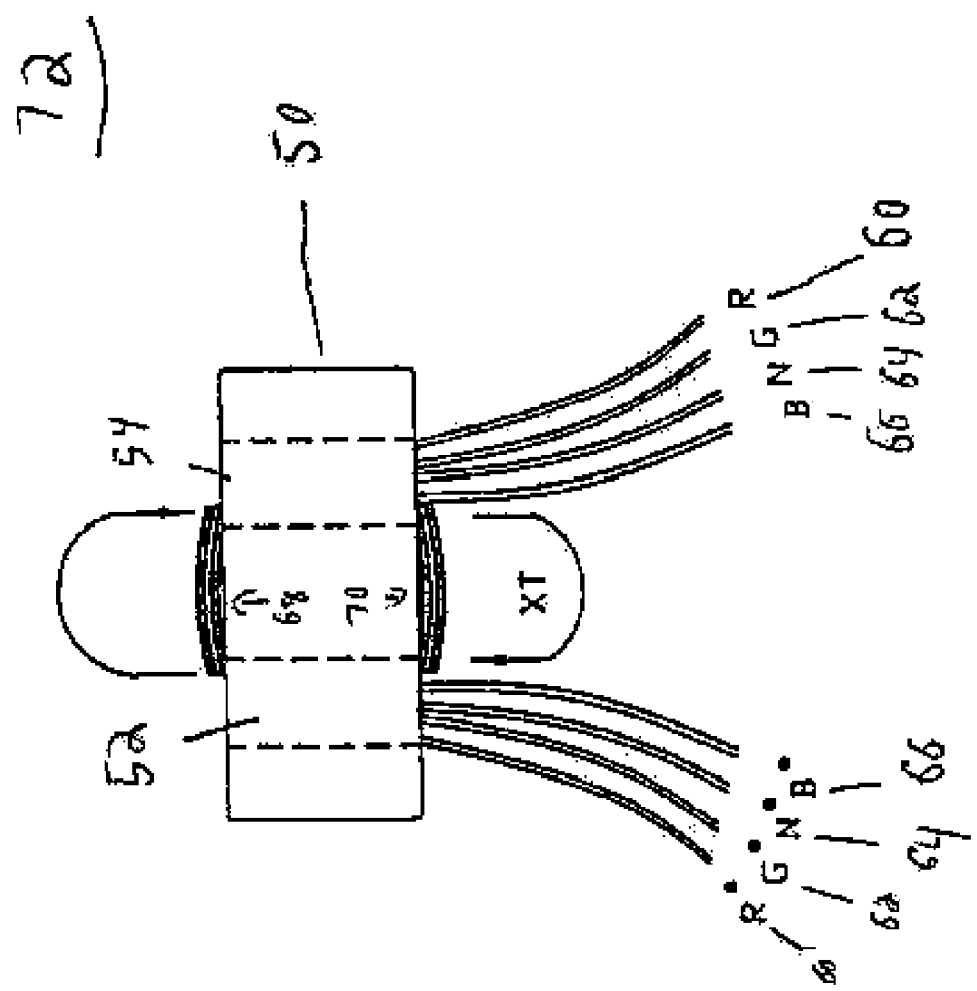
FIG. 3 is a side cutaway view of an isolating magnetic device for use in accordance with an embodiment of the invention.

Referring to FIG. 3, core 50 is used to produce an isolation magnetic device in accordance with an embodiment of the invention. As shown in FIG. 3, four pairs of wires 60, 62, 64 and 66 (shown as having colors red, green, natural and blue respectively) are wound around core 50. Each pair of wires 60, 62, 64, 66 may be initially twisted together. For example, the two red wires 60 are twisted together, the two green wires 62 are twisted together, etc. For example, Y number of twists may be made per each inch of wire. The wires may be, for example, MW83C class 180 (40QPN-180), AWG#40 wires. After the pairs of wires 60, 62, 64 and 66 are twisted, all four pairs are then inserted through hole 52, wrapped around a side 68 of core 50 and inserted through hole 54. If desired, wires 60, 62, 64 and 66 may then be wrapped around a second side 70 of core 50 and then inserted through hole 52 wrapped around side 68 and then inserted through hole 54 a desired number of windings. For example X number of windings may be used. In this way, an isolating magnetic device 72 may be formed. Such an isolating magnetic can handle communications of 10 gigabits per second and still be backward compatible so as to handle 10/100/1000 Base T communications. Such communication speeds are now required under IEEE standard 802.3. As shown in FIG. 3, dot notation is used to assist an assemblyman in assembling the device. The dots may indicate a starting point of each of wires 60, 62, 64 and 66.

Figure 4:
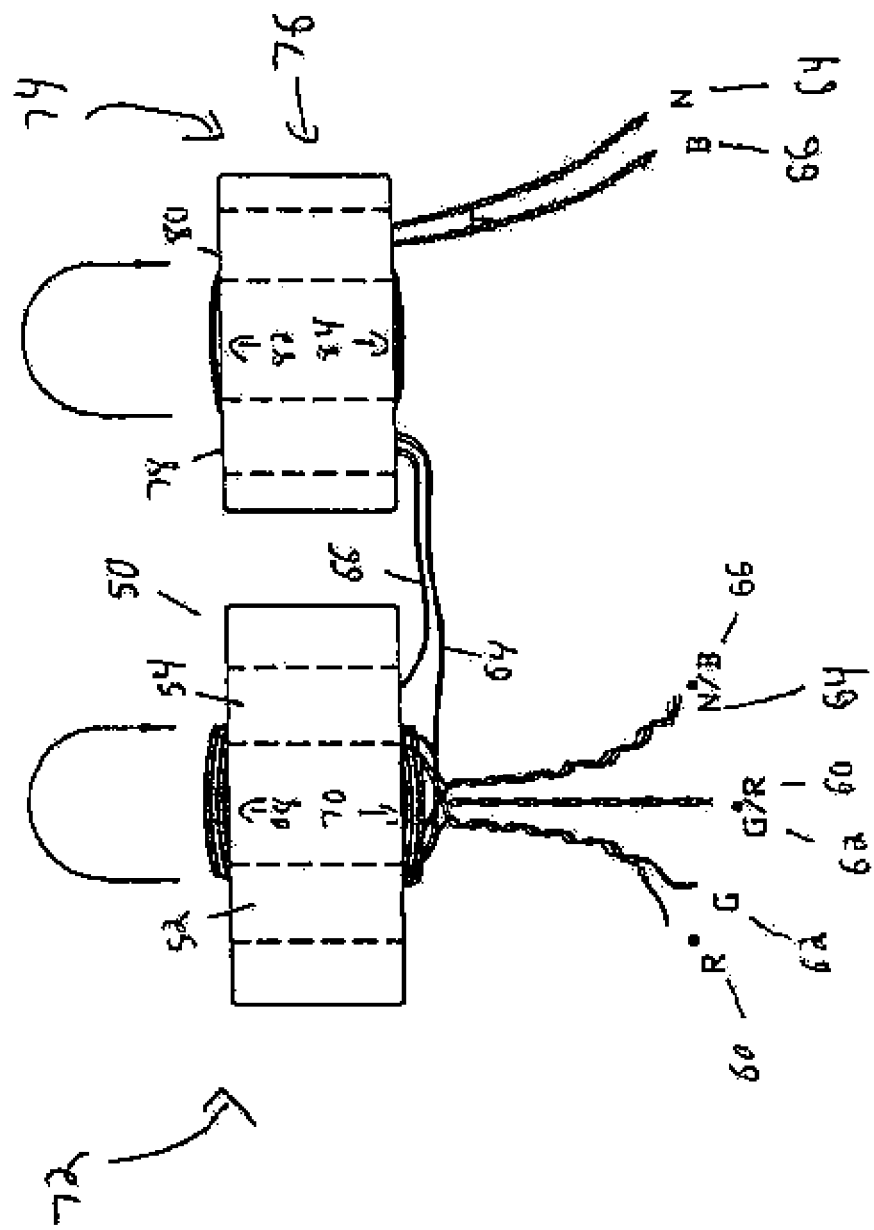
FIG. 4 is a side view of an isolating magnetic device and a common mode choke used in accordance with an embodiment of the invention.

Referring now to FIG. 4, magnetic device 72 can be combined with a common mode choke 74. After isolating magnetic device 72 is formed as was described with reference to FIG. 3, ends of wires 60, 62, 64 and 66 are twisted together. For example, a beginning of wire 60 (red) and ending of wire 62 (green) are twisted together. Similarly, an ending of wire 62 (green) and a beginning of wire 60 (red) are twisted together. A beginning of wire 64 (natural) and an ending of wire 66 (blue) are twisted together. Note that the ending of wire 64 and a beginning of wire 66 are not twisted together for isolating magnetic device 72. That is, an ending of wire 64 and a beginning of wire 66 are not twisted together. If choke 74 is used, the ending of wire 64 and the beginning of wire 66 are extended to a second core 76 which may be used to form a common mode choke 74. Core 76 may have the same construction as core 50 shown in FIG. 2 with, for example, a material permeability of 2500. That is, core 76 may have a first hole 78, a second hole 80 and first and second sides 82 and 84 respectively. In forming common mode choke 74, wires 64 and 66 are inserted through hole 78 wrapped around first side 82 of core 78 and then inserted through hole 80. If desired, wires 66 and 64 may then be wrapped around second side 84, inserted through hole 78, wrapped around first side 82 and inserted through a hole 80 a desired number of windings. For example, three windings may be used. After a desired number of windings have been made around core 76, wires 64 and 66 are individually twisted.

Figure 5:
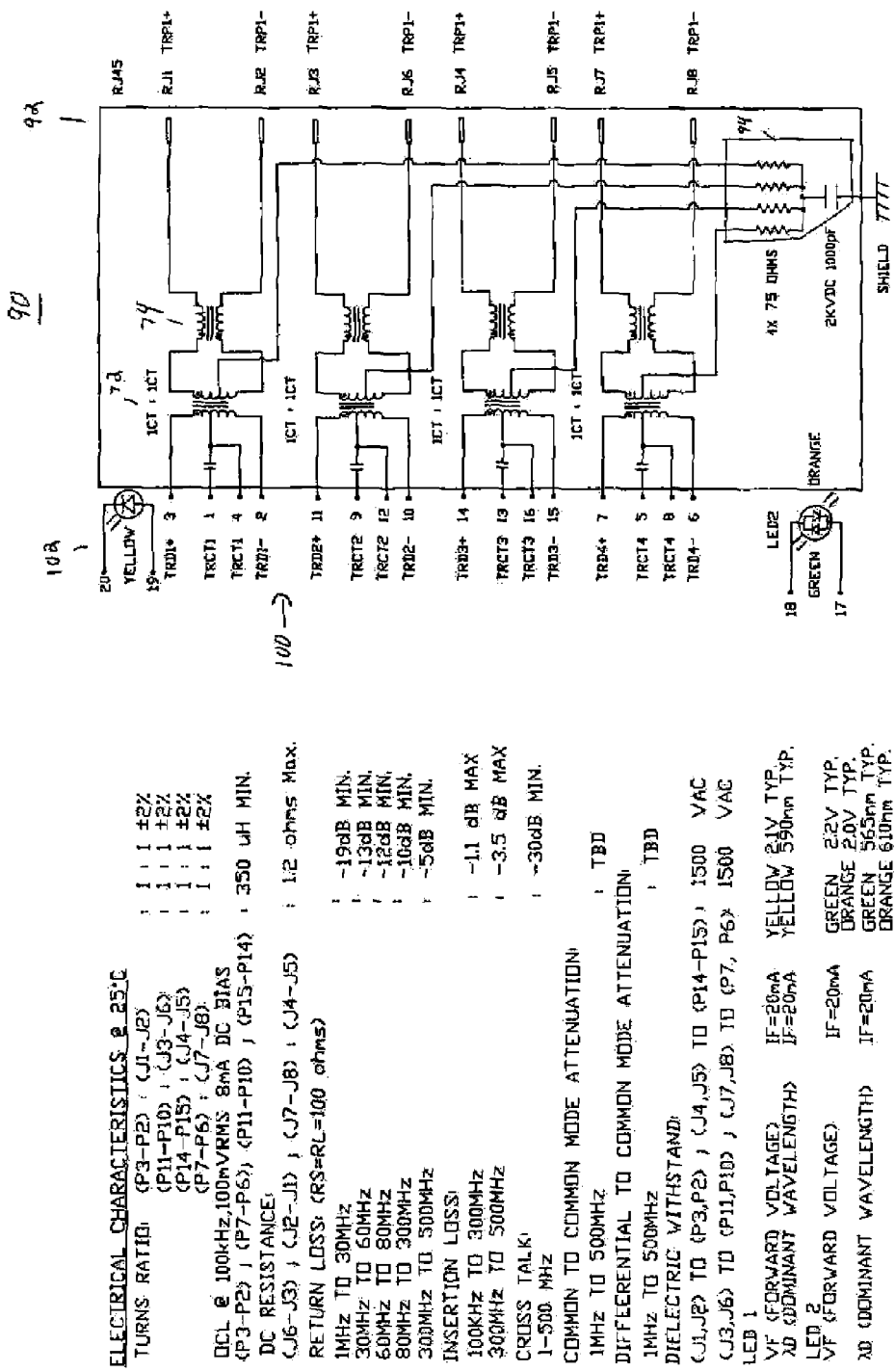
FIG. 5 is a diagram of a circuit including some tolerances of circuit devices including an isolating magnetic device and a common mode choke used in accordance with an embodiment of the invention.

Referring now to FIG. 5 there is shown a circuit 90 which could use electric device 72 and common mode choke 76 described above. Also shown are some tolerances which could be used for the circuit devices in circuit 90. Circuit 90 may be used in a connector and facilitate data communications between the connector and a plug (not shown). Circuit 90 includes contacts 92 which may communicate with the terminals of an inserted plug. An optional termination circuit 94 may be used to balance a load of wires in said plug. A magnetic filter circuit comprising one or both of common mode choke 74 and isolating magnetic device 72 may be coupled to or placed in communication with contacts 92. Terminals 100 may be used to transfer data to a device connected to circuit 90 or to the connector using circuit 90, and are coupled to or placed in communication with the magnetic filter circuit. Optional light emitting diodes 102 may be also used.

Circuit 90, incorporating device 72, may be used for communications of 10 Giga bits per second and may also be backward compatible so as to handle communications at speeds of 10 Base T, 100 Base T and 1,000 Base T. Moreover, circuit 90 may be used in a standard RJ45 type connector configuration. A winding method in accordance with the invention may use standard wiring making manufacture simple and easily available.

While preferred embodiments of the invention have been shown, the invention is only limited as defined by the scope of the accompanying claims.

What is claimed is:

1. A connector for enabling electrical communication with a plug, the connector comprising:
   at least one contact effective to communicate with a terminal of a plug;
   a magnetic filter circuit in communication with the contact; and
   a terminal in communication with the magnetic filter circuit; wherein
   the magnetic filter circuit includes an electric device formed by inserting at least one wire through a first hole of a core, wrapping the at least one wire around a side of the core;
   inserting the at least one wire through a second hole of the core, the second hole of the core being spaced from the first hole and having a longitudinal axis extending parallel to a longitudinal axis of the first hole.

2. The connector as recited in claim 1, wherein the electric device is further formed by repeating the steps of inserting at least one wire, wrapping, and inserting the at least one wire a desired number of times.

3. The connector as recited in claim 1, where the at least one wire comprises a first, second, third and fourth wire.

4. The connector as recited in claim 3, wherein each wire has a first end and a second end, the first end not being inserted through the core, the second end coming out from the second hole of the core, and wherein the electric device is further formed by:
   twisting together the first end of the first wire with the second end of the second wire;
   twisting together the first end of the second wire with the second end of the first wire; and
   twisting together the first end of the third wire with the second end of the fourth wire.

5. The connector as recited in claim 3, wherein the wires comprise four pairs of twisted wires.

6. The connector as recited in claim 3, wherein the core is a first core and the connector further comprises a common mode choke device formed by the steps of:
   inserting two of the wires through a third hole in a second core;
   wrapping the two of the wires around a side of the second core; and
   inserting the two of the wires through a fourth hole of the second core, the fourth hole of the second core being spaced from the third hole of the second core and having a longitudinal axis extending parallel to a longitudinal axis of the third hole.

7. The connector as recited in claim 6, wherein each wire has a first end and a second end, the first end not being inserted through the first core, the second end coming out from the second hole of the first core, and wherein the electric device is further formed by:
- twisting together the first end of the first wire with the second end of the second wire;
- twisting together the first end of the second wire with the second end of the first wire; and
- twisting together the first end of the third wire with the second end of the fourth wire.

8. The connector as recited in claim 7, wherein the two of the wires include the second end of the third wire and the first end of the fourth wire.

9. The connector as recited in claim 6, wherein the common mode choke device is further produced by repeating the steps of inserting two of the wires, wrapping the two of the wires, and inserting the two of the wires, a desired number of times.

10. A connector for enabling electrical communication with a plug, the connector comprising:
- at least one contact effective to communicate with a terminal of a plug;
- a magnetic filter circuit in communication with the contact; and
- a terminal in communication with the magnetic filter circuit; wherein
- the magnetic filter circuit includes an electric device, the electric device including a core, the core having a first hole with a first longitudinal axis and a second hole spaced from the first hole, the second hole having a second longitudinal axis parallel to the first longitudinal axis, the core including at least one wire inserted through the first hole, wrapped around a side of the core and inserted through the second hole.

11. The connector as recited in claim 10, wherein the at least one wire is inserted through the first hole, wrapped around the side of the core, and inserted through the second hole a desired number of times.

12. A method for producing a connector for enabling electrical communication with a plug, the method comprising:
- inserting at least one wire through a first hole of a core, wrapping the at least one wire around a side of the core;
- inserting the at least one wire through a second hole of the tore to form an electric device, the second hole of the core being spaced from the first hole and having a longitudinal axis extending parallel to a longitudinal axis of the first hole;
- coupling the electric device to at least one terminal; and
- coupling the electric device to at least one contact.

13. The method as recited in claim 12, wherein the electric device is further formed by repeating the steps of inserting at least one wire, wrapping, and inserting the at least one wire a desired number of times.

14. The method as recited in claim 12, where the at least one wire comprises a first, second, third and fourth wire.

15. The method as recited in claim 14, wherein each wire has a first end and a second end, the first end not being inserted through the core, the second end coming out from the second hole of the core, and wherein the electric device is further formed by:
- twisting together the first end of the first wire with the second end of the second wire;
- twisting together the first end of the second wire with the second end of the first wire; and
- twisting together the first end of the third wire with the second end of the fourth wire.

16. The method as recited in claim 14, wherein the wires comprise four pairs of twisted wires.

17. The method as recited in claim 14, wherein the core is a first core and the connector further comprises a common mode choke device formed by the steps of:
- inserting two of the wires through a third hole in a second core;
- wrapping the two of the wires around a side of the second core; and
- inserting the two of the wires through a fourth hole of the second core, the fourth hole of the second core being spaced from the third hole of the second core and having a longitudinal axis extending parallel to a longitudinal axis of the third hole.

18. The method as recited in claim 17, wherein each wire has a first end and a second end, the first end not being inserted through the first core, the second end coming out from the second hole of the first core, and wherein the electric device is further formed by:
- twisting together the first end of the first wire with the second end of the second wire;
- twisting together the first end of the second wire with the second end of the first wire; and
- twisting together the first end of the third wire with the second end of the fourth wire.

19. The method as recited in claim 18, wherein the two of the wires include the second end of the third wire and the first end of the fourth wire.

20. The method as recited in claim 17, wherein the common mode choke device is further produced by repeating the steps of inserting two of the wires, wrapping the two of the wires, and inserting the two of the wires, a desired number of times.

* * * * *